(12) United States Patent
Kim et al.

(10) Patent No.: US 7,829,437 B2
(45) Date of Patent: Nov. 9, 2010

(54) METHOD OF MANUFACTURING A SEMICONDUCTOR DEVICE

(75) Inventors: Young-Hoo Kim, Yongin-si (KR); Hyun Park, Hwaseong-si (KR); Byung-Hong Chung, Seoul (KR); Jeong-Lim Nam, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 169 days.

(21) Appl. No.: 12/214,019

(22) Filed: Jun. 16, 2008

(65) Prior Publication Data

US 2009/0004826 A1    Jan. 1, 2009

(30) Foreign Application Priority Data

Jun. 29, 2007    (KR) ...................... 10-2007-0065660

(51) Int. Cl.
*H01L 21/30* (2006.01)

(52) U.S. Cl. ................. 438/459; 438/257; 257/E21.645

(58) Field of Classification Search ................. 438/197, 438/257, 637; 257/314, 776, 390
See application file for complete search history.

(56) References Cited

U.S. PATENT DOCUMENTS

| 6,593,184 | B2 | 7/2003 | Han |
| 6,602,760 | B2 * | 8/2003 | Poortmans et al. ........... 438/455 |
| 6,905,919 | B2 * | 6/2005 | Chan et al. ................... 438/151 |
| 7,230,294 | B2 * | 6/2007 | Lee et al. ..................... 257/314 |
| 2002/0050634 | A1 | 5/2002 | Han |
| 2003/0164005 | A1 * | 9/2003 | Saito et al. ................. 65/30.14 |
| 2005/0037612 | A1 * | 2/2005 | Goda et al. ................. 438/637 |
| 2006/0108627 | A1 * | 5/2006 | Choi et al. ................... 257/314 |
| 2007/0232512 | A1 * | 10/2007 | Nishiwaki ................... 510/175 |

FOREIGN PATENT DOCUMENTS

| JP | 08-125121 | 5/1996 |
| JP | 2001-189419 | 7/2001 |
| KR | 0537552 | 12/2005 |

* cited by examiner

*Primary Examiner*—Thanh V Pham
*Assistant Examiner*—Mark A Laurenzi, III
(74) *Attorney, Agent, or Firm*—Mills & Onello, LLP

(57) ABSTRACT

In a method of manufacturing a semiconductor device, a first substrate and a second substrate, which include a plurality of memory cells and selection transistors, respectively, are provided. A first insulating interlayer and a second insulating interlayer are formed on the first substrate and the second substrate, respectively, to cover the memory cells and the selection transistors. A lower surface of the second substrate is partially removed to reduce a thickness of the second substrate. The lower surface of the second substrate is attached to the first insulating interlayer. Plugs are formed through the second insulating interlayer, the second substrate and the first insulating interlayer to electrically connect the selection transistors in the first substrate and the second substrate to the plugs. Thus, impurity ions in the first substrate will not diffuse during a thermal treatment process.

20 Claims, 7 Drawing Sheets

METHOD OF MANUFACTURING A SEMICONDUCTOR DEVICE

CROSS REFERENCES TO RELATED APPLICATIONS

This application claims priority under 35 U.S.C. §119 to Korean Patent Application No. 10-2007-0065660, filed on Jun. 29, 2007 in the Korean Intellectual Property Office (KIPO), the contents of which are herein incorporated by reference in their entirety.

BACKGROUND OF THE INVENTION

1. Field of the Invention

The present invention relates to a method of manufacturing a semiconductor device. More particularly, aspects of the present invention relate to a method of manufacturing a semiconductor device that includes a dielectric layer, which includes metal oxide having a high dielectric constant, on a charge-trapping layer.

2. Description of the Related Art

Generally, a semiconductor memory device may be classified as either a volatile memory device, such as a dynamic random access memory (DRAM) device, a static random access memory (SRAM) device, etc., that loses data over time, or a non-volatile memory device that continuously stores data regardless of the passage of time. Data is rapidly inputted/outputted into/from the volatile memory device. In contrast, data is slowly inputted/outputted into/from the non-volatile memory device. The non-volatile memory device may include an electrically erasable programmable read-only memory (EEPROM), a flash EEPROM memory device, etc., capable of electrically inputting/outputting data. The flash EEPROM memory device electrically controls input/output of data using Fowler-Nordheim (F-N) tunneling or channel hot electron injection to perform programming and erasing operations. The flash memory device may be classified as a floating gate-type non-volatile memory device, a silicon-oxide-nitride-oxide-silicon (SONOS)-type non-volatile memory device, or a metal-oxide-nitride-oxide-silicon (MONOS)-type non-volatile memory device.

A unit cell of the SONOS-type or the MONOS-type non-volatile memory device may include a tunnel oxide layer formed on a semiconductor substrate, a charge-trapping layer including silicon nitride for trapping electrons from a channel region, a dielectric layer formed on the charge-trapping layer, a gate electrode structure including a conductive layer that is formed on the dielectric layer, and a spacer formed on a sidewall of the gate electrode structure.

As semiconductor devices have become highly integrated, a stack-type memory device has been developed. The stack-type memory device may include a multi-channel layer formed by vertically stacking a plurality of non-volatile memory cells, and a deep contact for electrically coupling between the channel layers.

Here, when the MONOS-type stack memory device has dual channel regions, two semiconductor substrates may be vertically attached to each other.

According to a method of manufacturing the MONOS-type stack memory device, a plurality of memory cells is formed on a first semiconductor substrate. A second semiconductor substrate is attached to the first semiconductor substrate. Here, before attaching the second semiconductor substrate to the first semiconductor substrate, a hydrogen ion implantation region in the second semiconductor substrate may be thermally treated to separate a portion of the second semiconductor substrate from the remainder of the second semiconductor substrate. A plurality of memory cells is formed on the second semiconductor substrate, after the second semiconductor substrate is attached to the first semiconductor substrate. Thus, the process for forming the memory cells on the second semiconductor substrate is performed under a condition in which the first semiconductor substrate and the second semiconductor substrate are attached to each other.

However, when gate electrode structures of the memory cells on the second semiconductor substrate are formed as the MONOS-type, it may be difficult to perform the thermal treatment because of a thermal diffusion of impurity ions in the first semiconductor substrate generated when forming the dielectric layer that includes the metal oxide having the high dielectric constant. For example, to densify a crystalline structure of the dielectric layer including aluminum oxide ($Al_2O_3$), the dielectric layer may be thermally treated at a high temperature of about 900° C. to about 1,100° C. Here, the impurity ions in the impurity regions of the first semiconductor substrate may thermally diffuse when temperatures are in the high temperature range. Therefore, since it may be very difficult to form the channel region, operational characteristics of the semiconductor device may be deteriorated.

In contrast, when the thermal treatment is performed at a relatively low temperature to maintain an ion doping profile of the impurity regions in the first semiconductor substrate, the crystalline structure of the dielectric layer may become sparse, so that the memory cell of the semiconductor device may have low reliability. Thus, it may be required to improve the operational characteristics of the unit cell when the semiconductor device has the stack-type memory cell.

SUMMARY OF THE INVENTION

In accordance with aspects of the present invention provided are methods of manufacturing a semiconductor device that are capable of densifying a crystalline structure of a dielectric layer by a thermal treatment process, without a thermal diffusion of ions in a lower impurity region when forming an upper gate electrode structure.

In a method of manufacturing a semiconductor device in accordance with one aspect of the present invention, a first substrate and a second substrate, which include a plurality of memory cells and selection transistors, respectively, are provided. A first insulating interlayer and a second insulating interlayer are formed on the first substrate and the second substrate, respectively, to cover the memory cells and the selection transistors. A lower surface of the second substrate is partially removed to reduce a thickness of the second substrate, forming a thinned second substrate. The lower surface of the thinned second substrate is attached to the first insulating interlayer. Plugs are formed through the second insulating interlayer, the second substrate, and the first insulating interlayer to electrically connect the selection transistors in the first substrate and the second substrate using the plugs.

The second insulating interlayer may have a thickness of about 1.5 times to about 3.0 times that of the first insulating interlayer.

Partially removing the lower surface of the second substrate may include planarizing the lower surface of the second substrate by a chemical mechanical polishing (CMP) process, and removing the planarized lower surface of the second substrate by a wet etching process.

Further, the method may include forming a protective layer on the second substrate to prevent the second substrate from breaking during removal of the lower surface of the second substrate.

Here, the protective layer may include a silicon oxide layer or a photoresist film, as examples.

The wet etching process may use an etching solution that includes water or an acetic acid ($CH_3COOH$) solution mixed with nitric acid ($HNO_3$) and hydrofluoric acid.

The wet etching process may include spraying an etching solution on the planarized lower surface of the second substrate with the second substrate being rotated.

Further, the method may include, after the wet etching process, cleaning the second substrate to remove particles on the second substrate.

The thinned second substrate may have a thickness of about 0.01 times to about 0.03 times that of the first substrate.

Particularly, the thickness of the thinned second substrate may be about 0.05 μm to about 1.50 μm.

Each of the memory cells may include a gate structure having a metal-first oxide-silicon nitride-second oxide-silicon (MONOS) structure and impurity regions formed at different sides of the gate structure.

The metal may include tantalum nitride.

The first oxide may include any one of aluminum oxide ($Al_2O_3$), zirconium oxide ($ZrO_2$), zirconium silicate ($ZrSiO_4$), hafnium oxide ($HfO_2$), hafnium silicate (HfSiO), and the like.

The method may include thermally treating the gate structure at a temperature of about 850° C. to about 1,200° C. to crystallize the first oxide.

Attaching the first substrate and the second substrate to each other may include thermally treating the first and second substrates at a temperature of about 350° C. to about 450° C.

Furthermore, the plugs may include polysilicon doped with impurities, metal, metal silicide, and the like.

The plugs may be formed by forming contact holes through the second insulating interlayer, the second substrate, and the first insulating interlayer, and by filling the contact holes with a conductive material.

Here, after forming the contact holes, a barrier layer may be additionally formed on inner surfaces of the contact holes and an upper surface of the second insulating interlayer.

In accordance with another aspect of the invention, provided is a method of manufacturing a semiconductor device. The method comprises providing a first substrate and a second substrate each having a plurality of memory cells and selection transistors formed thereon; forming a first insulating interlayer on the first substrate and a second insulating interlayer and the second substrate to cover the memory cells and the selection transistors respectively formed thereon; forming a thinned second substrate by partially removing a lower surface of the second substrate; attaching a lower surface of the thinned second substrate to the first insulating interlayer of the first substrate; and forming at least one plug through the second insulating interlayer, the thinned second substrate, and the first insulating interlayer to electrically connect a selection transistor on the first substrate to a corresponding selection transistor on the second substrate. Forming the plugs includes forming contact holes through the second insulating interlayer, the second substrate and the first insulating interlayer; and filling the contact holes with a conductive material.

Forming the at least one plug may include forming a first plug electrically connecting a source selection transistor formed on the first substrate to a source selection transistor formed on the second substrate and forming a second plug electrically connecting a ground selection transistor formed on the first substrate to a ground selection transistor formed on the second substrate.

According to the present invention, a stack-type memory cell may be manufactured by preparing a first substrate and a second substrate that includes serially connected memory cells and insulating interlayers covering the memory cells, reducing the thickness of the second substrate, and attaching the second substrate to the first substrate. That is, the memory cells may be formed on the second substrate under a condition in which the second substrate is separated from the first substrate. Thus, when the memory cells are formed on the second substrate, impurity ions in the first substrate may not diffuse during a thermal treatment process. As a result, a dielectric layer may be densified by the thermal treatment process so that a channel region may be readily formed. Further, since plugs may be electrically connected to the memory cells by a single process after forming the memory cells, a method of manufacturing a semiconductor device may be simplified.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DESCRIPTION OF THE PREFERRED EMBODIMENTS

Figure 1:
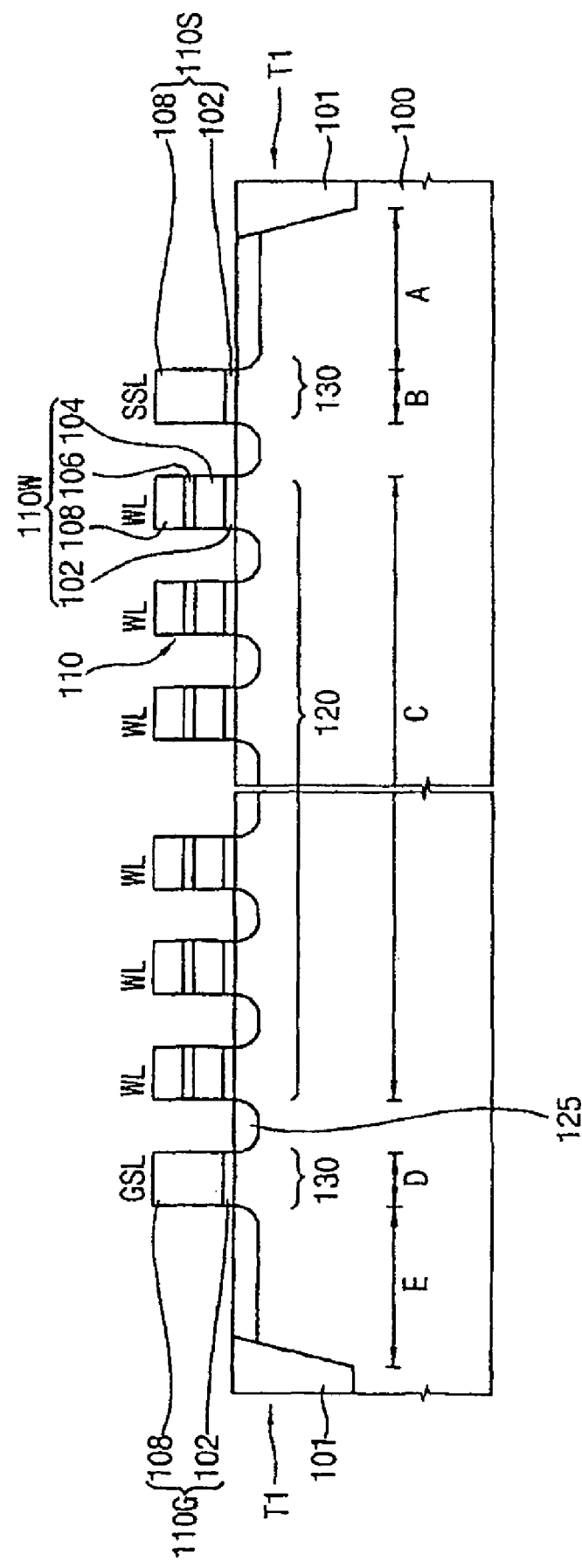
FIGS. 1 to 7 are cross-sectional views illustrating various process steps of an embodiment of a method of manufacturing a semiconductor device in accordance with aspects of the present invention.

Hereinafter, aspects of the present invention will be described by explaining illustrative embodiments in accordance therewith, with reference to the attached drawings. While describing these embodiments, detailed descriptions of well-known items, functions, or configurations are typically omitted for conciseness.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Figure 2:
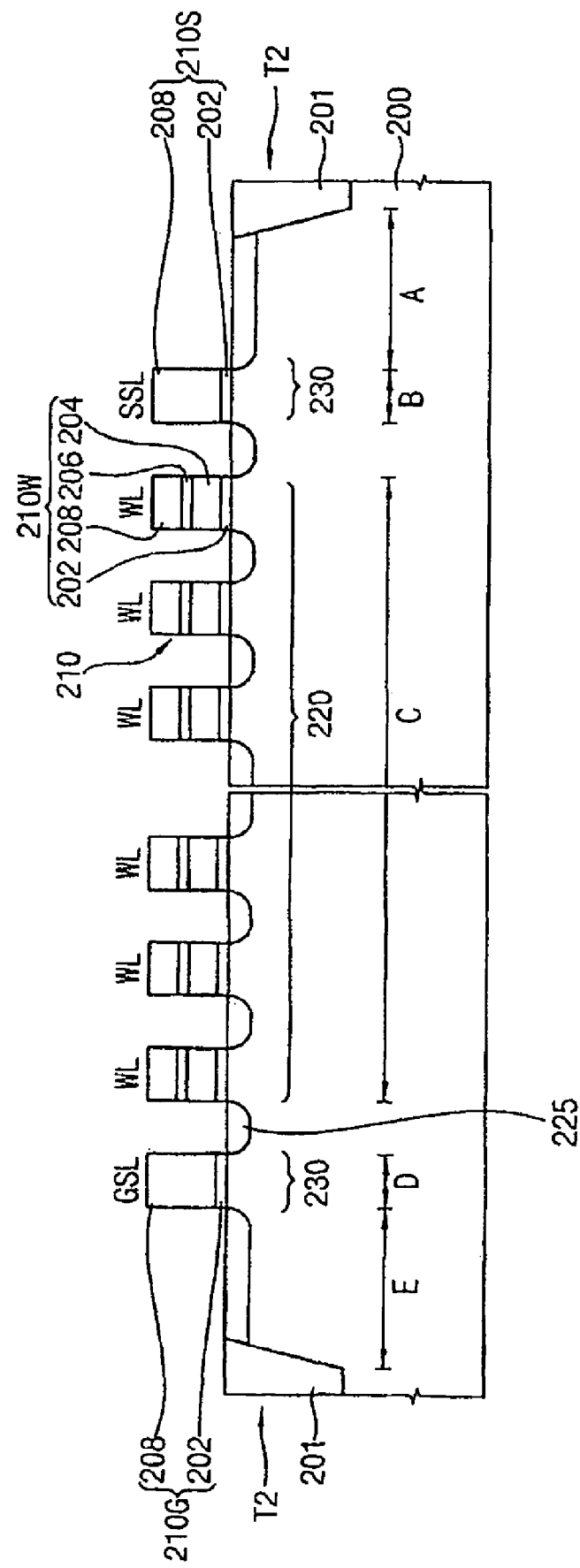
Figure 3:
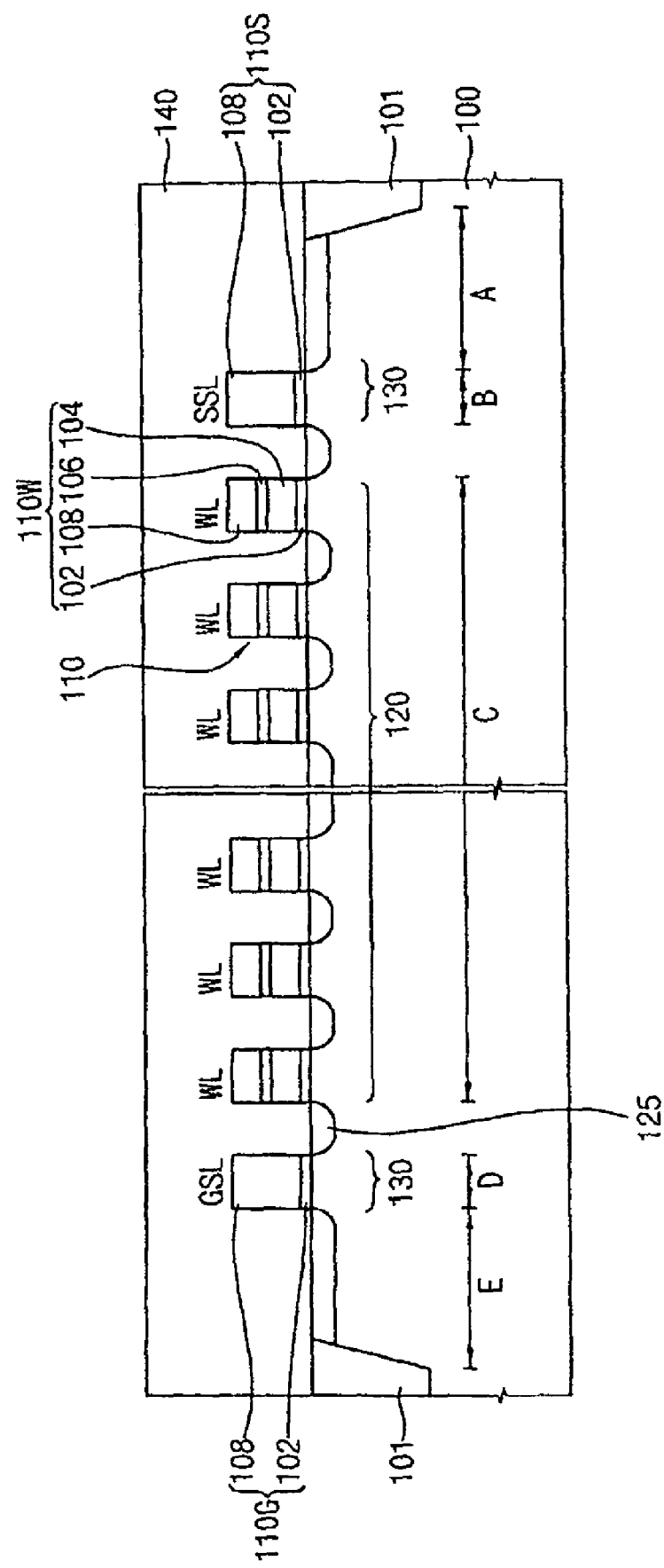
Figure 4:
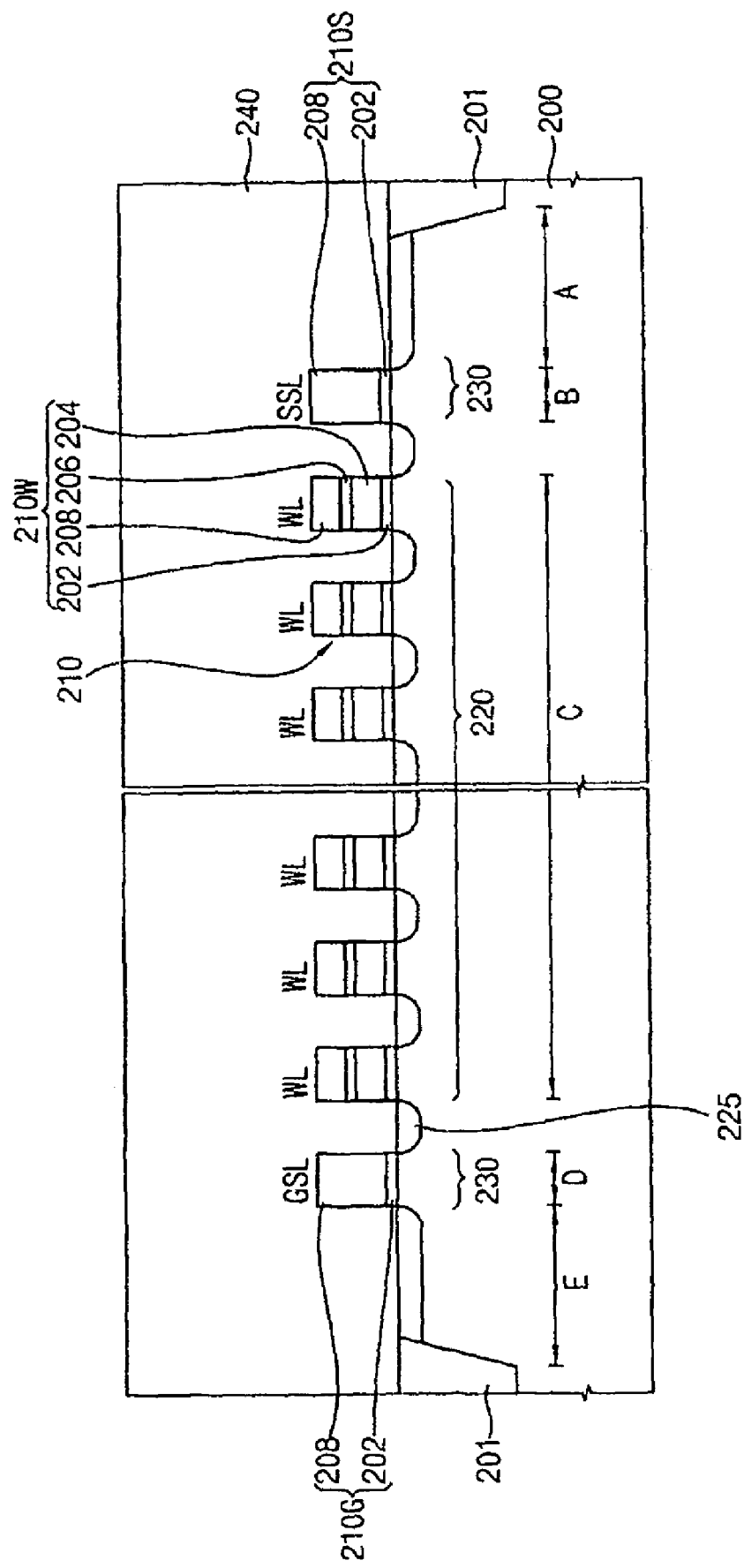
Figure 5:
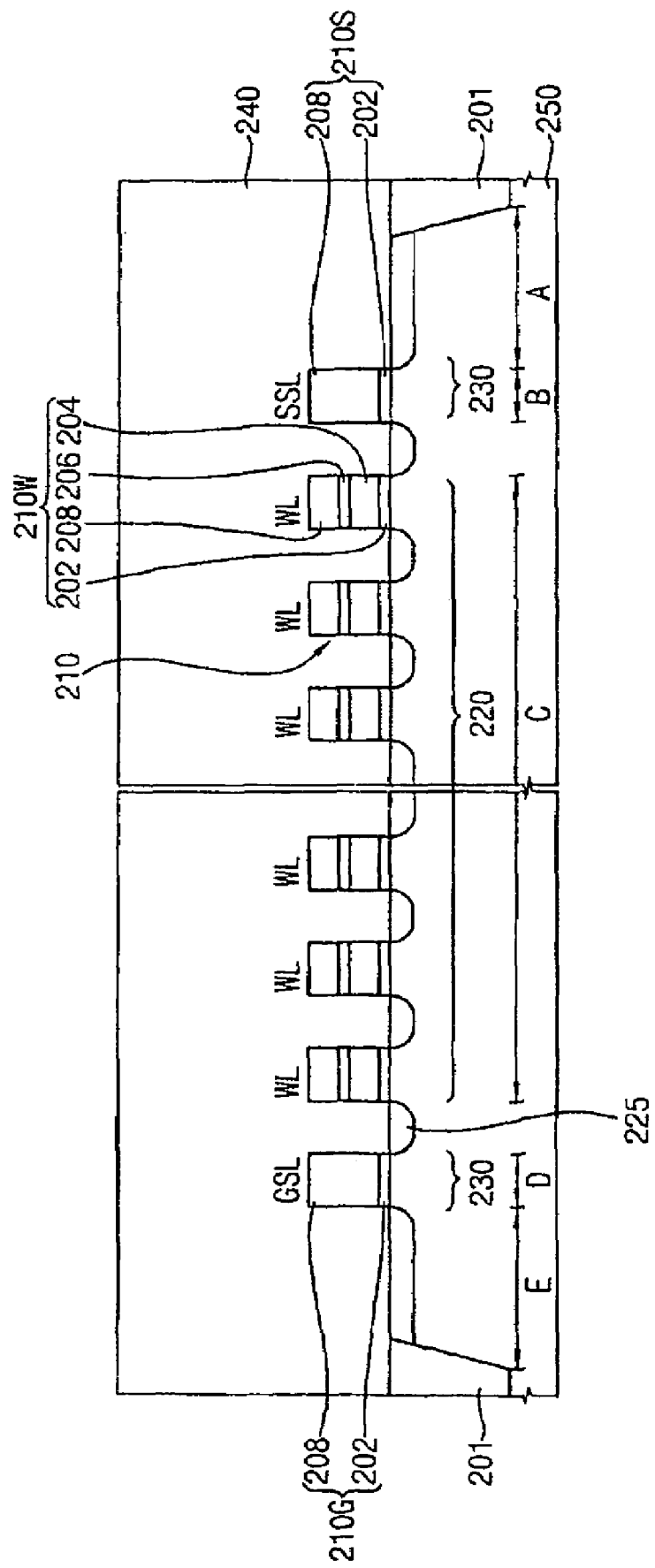

FIGS. 1 to 7 are cross-sectional views illustrating various process steps of an embodiment of a method of manufacturing a semiconductor device in accordance with aspects of the present invention. Here, FIGS. 1 and 3 are cross-sectional views illustrating processes performed on a first semiconductor substrate, and FIGS. 2, 4 and 5 are cross-sectional views illustrating processes performed in a second semiconductor substrate. In this embodiment the semiconductor device corresponds to a stack-type memory device having a stack structure where NAND-type flash memory cells are stacked.

Referring to FIGS. 1 and 2, trenches T1 are formed along a first direction at a surface of the first semiconductor substrate 100, such as a silicon wafer. The trenches T1 are filled with field insulating layers to form first isolating layers 101, which define an active region and an isolation region of the first semiconductor substrate 100. Further, trenches T2 are formed along the first direction at a surface of the second semiconductor substrate 200, such as a silicon wafer. The trenches T2 are filled with field insulating layers to form second isolating layers 201, which define an active region and an isolation region of the second semiconductor substrate 200. In this example embodiment, the first isolating layers 101 and the second isolating layers 201 may be formed at the surfaces of the first semiconductor substrate 100 and the second semiconductor substrate 200, respectively, by a local oxidation of silicon (LOCOS) process, a shallow trench isolation (STI) process, etc.

Each of the first semiconductor substrate 100 and the second semiconductor substrate 200 may include a contact region A, a string selection transistor region B, a memory cell region C, a ground selection transistor region D, and a common source line region E. The contact region A may include a region to which a plug of a bit line is connected. The common source line region D may include a region to which a plug of a metal wiring is connected.

First memory cells 120 are formed on the active region of the first semiconductor substrate 100. In this example embodiment, the first memory cells 120 may include a plurality of word lines WL arranged in parallel with one another. Further, second memory cells 220 are formed on the active region of the second semiconductor substrate 200. In this example embodiment, the second memory cells 220 may also include a plurality of word lines WL arranged in parallel with one another.

When forming the word lines WL on the first substrate 100, first selection transistors 130 are formed at both sides of the word lines WL. Further, when forming the word lines WL on the second substrate 100, second selection transistors 230 are also formed at both sides of the word lines WL. Each of the first selection transistors 130 and the second selection transistors 230 includes a string selection line SSL and a ground selection line GSL arranged in parallel with the word lines WL. Here, the string selection line SSL, the ground selection line GSL and the word lines WL arranged between the string selection line SSL and the ground selection line GSL may correspond to a unit string of a single NAND flash memory device. Further, the string selection line SSL, the ground selection line GSL and the word lines WL may be symmetrically and repeatedly arranged.

Each of the first memory cells 120 and the second memory cells 220 may include a tunnel oxide layer, a charge-trapping layer, a dielectric layer, and a control gate electrode. Further, each of the first selection transistors 130 and the second selection transistors 230 may include a gate oxide layer and a gate electrode sequentially stacked. In this example embodiment, the first memory cells 120 may include a first gate structure 110 and the second memory cells 220 may include a second gate structure 210. Each of the first gate structure 110 and the second gate structure 210 may have a metal-first oxide-silicon nitride-second oxide-silicon (MONOS) structure. For example, the metal may include tantalum nitride. The first oxide may include aluminum oxide ($Al_2O_3$), zirconium oxide ($ZrO_2$), zirconium silicate ($ZrSiO_4$), hafnium oxide ($HfO_2$), hafnium silicate (HfSiO), and the like.

Further, first impurity regions 125 may be formed in the first semiconductor substrate 100 at both sides of the first gate structure 110. Likewise, second impurity regions 225 may be formed in the second semiconductor substrate 200 at both sides of the second gate structure 210.

In this example embodiment, the first memory cells 120 may be serially connected to one another. Further, the second memory cells 220 may also be serially connected to one another. The first impurity regions 125 and the second impurity regions 225 may serve as common source/drain regions of adjacent cells.

Referring again to FIG. 1, the first gate structures 110 may be formed by sequentially forming a first tunnel oxide layer (not shown), a first charge-trapping layer (not shown), a first dielectric layer (not shown), and a first conductive layer (not shown) on the first semiconductor substrate 100, and by patterning the first tunnel oxide layer, the first charge-trapping layer, the first dielectric layer and the first conductive layer.

In this example embodiment, the first tunnel oxide layer may be formed by a thermal oxidation process, a chemical vapor deposition (CVD) process, an atomic layer deposition (ALD) process, and the like, as examples. For example, the first tunnel oxide layer may be formed by the thermal oxidation process using silicon oxide to have a thickness of about 10 Å to about 50 Å. Particularly, the first tunnel oxide layer having a thickness of about 35 Å may be formed on the first semiconductor substrate 100. Alternatively, to provide the first tunnel oxide layer of the memory cells and the first gate oxide layer of the selection transistors with different thicknesses, the first tunnel oxide layer may be formed by growing the first gate oxide layer from the surface of the first semiconductor substrate 100, and by partially removing the first gate oxide layer in the cell transistor region by a photolithography process.

The first charge-trapping layer may be formed on the first tunnel oxide layer to trap electrons from a channel region of the first semiconductor substrate 100. The first charge-trapping layer may have trap sites used for a floating gate of the first memory cell 120. Further, the first charge-trapping layer may include silicon nitride. The first charge-trapping layer may be formed on the first tunnel oxide layer by a low-pressure chemical vapor deposition (LPCVD) process to have a thickness of about 20 Å to about 50 Å. Particularly, the first charge-trapping layer having a thickness of about 35 Å may be formed on the first tunnel oxide layer.

The first dielectric layer may be formed on the first charge-trapping layer to provide electrical insulation between the first charge-trapping layer and the first conductive layer. The first dielectric layer may include a metal oxide having a dielectric constant higher than that of silicon oxide. The metal oxide may include aluminum oxide ($Al_2O_3$), zirconium oxide ($ZrO_2$), zirconium silicate ($ZrSiO_4$), hafnium oxide ($HfO_2$), hafnium silicate (HfSiO), and the like. For example, the first dielectric layer may include the aluminum oxide formed by a CVD process, an ALD process, and so on. The first dielectric layer may have a thickness of about 100 Å to about 400 Å, and preferably has a thickness of about 200 Å in this embodiment.

In this example embodiment, after forming the first dielectric layer, the first semiconductor substrate 100 may be thermally treated at a high temperature. For example, the thermal treatment process may be performed at a temperature of about 850° C. to about 1,200° C. Further, the thermal treatment process may be performed under a gas atmosphere including $N_2$, $O_2$, $NH_3$, $N_2O$ or a mixture thereof. For example, the thermal treatment process may be performed in a furnace at a temperature of about 1,080° C. for about 120 seconds.

The first conductive layer may be formed on the first dielectric layer. The first conductive layer may serve as a control gate of the memory cell transistors. In this example embodiment, the first conductive layer may include a first metal nitride layer, a second metal nitride layer, and a first metal layer.

The first metal nitride layer may serve as a metal barrier layer. Examples of the first metal nitride layer may include titanium nitride, tantalum nitride, tantalum carbon nitride, hafnium nitride, and the like. In this example embodiment, the first metal nitride layer may include the tantalum nitride. Further, the first metal nitride layer having a thickness of about 200 Å may be formed on the first dielectric layer.

The second metal nitride layer may serve as an adhesion layer. The second metal nitride layer may include tungsten nitride. In this example embodiment, the second metal nitride layer having a thickness of about 50 Å may be formed on the second metal nitride layer.

The first metal layer may include tungsten. The first metal layer having a thickness of about 300 Å may be formed on the second metal nitride layer. Alternatively, the first metal layer may include a metal silicide, such as tungsten silicide, tantalum silicide, cobalt silicide, titanium silicide, and so on.

After forming the first conductive layer, a first photoresist pattern (not shown) may be formed on the first conductive layer. The first conductive layer, the first dielectric layer and the first charge-trapping layer may then be anisotropically etched using the first photoresist pattern as an etching mask to form a first control gate electrode 108 including a first metal nitride layer pattern (not shown), a second metal nitride layer pattern (not shown), and a first metal layer pattern (not shown) sequentially formed on the first dielectric layer.

Here, the first metal nitride layer pattern may function as a gate electrode. Further, the first metal layer pattern may serve as a word line.

Portions of the first dielectric layer, the first charge-trapping layer and the first tunnel oxide layer exposed by the first photoresist pattern may be dry-etched to form the first gate electrode structures 110 including a first tunnel oxide layer pattern 102, a first charge-trapping layer pattern 104, a first dielectric layer pattern 106 and the first control gate electrode 108 on the memory cell region of the first semiconductor substrate 100. After forming the first gate structures 110, the first photoresist pattern may be removed by an ashing process and/or a stripping process, as examples.

Simultaneously, a gate electrode structure 110S of the string selection line SSL and a gate electrode structure 110G of the ground selection line GSL may be formed. Each of the gate electrode structure 110S of the string selection line SSL and the gate electrode structure 110G of the ground selection line GSL may include the first gate oxide layer pattern 102 and the first gate electrode 108. In this example embodiment, the first gate oxide layer pattern 102 may include silicon oxide. The first gate electrode 108 may include polycrystalline silicon, tungsten silicide, and the like. The gate electrode structure 110S of the string selection line SSL may be electrically coupled to a bit line (not shown). The gate electrode structure 110G of the ground selection line GSL may be electrically coupled to a common source electrode (not shown) and a wiring (not shown).

Additionally, a re-oxidation process may be performed to cure damage to the first semiconductor substrate 100 and the first gate structures 110 generated during the etching process used to form the first gate structures 110. A first gate spacer (not shown) may be formed on sidewalls of the first gate structures 110 by the re-oxidation process.

The first impurity region 125, i.e., source/drain regions, may be formed in the surface of the first semiconductor substrate 100 adjacent to the first gate electrode structures 110 of the first memory cells 120 and the selection transistors 130. In this example embodiment, the first impurity region 125 may be formed by an ion implantation process and a thermal treatment process using the first gate structures 110 and the first gate spacer as an ion implantation mask.

Referring again to FIG. 2, the second memory cells 220 including the second gate electrode structures 210 may be formed on the active region of the second semiconductor substrate 200. The second gate electrode structures 210 may include a plurality of word lines WL arranged in parallel with one another. Simultaneously, selection transistors 230 including a gate electrode structure 210S of the string selection line SSL and a gate electrode structure 210G of the ground selection line GSL may be formed.

Each of the second gate structures 210 of the word lines WL may include a second tunnel oxide layer pattern 202, a second charge-trapping layer pattern 204, a second dielectric layer pattern 206, and a second control gate electrode 208. Each of the gate electrode structure 210S of the string selection line SSL and the gate electrode structure 210G of the ground selection line GSL may include a second gate oxide layer pattern 202 and a second gate electrode 208 sequentially stacked.

The second impurity region 225, i.e., source/drain regions may be formed in the surface of the second semiconductor substrate 200 adjacent to the second gate electrode structures 210 of the second memory cells 220 and the selection transistors 230. The second memory cells 220 may be serially connected to one another. Further, the second impurity region 225 may serve as a common source/drain region of adjacent cells.

Here, processes for forming the second gate electrode structures 210 and the second impurity region 225 in FIG. 2 may be substantially the same as those with reference to FIG. 1. Thus, any further illustrations with respect to the same processes are omitted herein for brevity.

In this example embodiment, after forming the second dielectric layer on the second charge-trapping layer, the second semiconductor substrate 200 may be thermally treated at a high temperature to crystallize the second dielectric layer. For example, the thermal treatment process may be performed at a temperature in the range of about 850° C. to about 1,200° C. Further, the thermal treatment process may be performed under a gas atmosphere including $N_2$, $O_2$, $NH_3$, $N_2O$ or a mixture thereof.

Here, after the second memory cells 220 are formed on the second semiconductor substrate 200 under a condition in which the second semiconductor substrate 200 is separated from the first semiconductor substrate 100, the first semiconductor substrate 100 and the second semiconductor substrate 200 may be attached to each other by a subsequent process. In contrast, according to a conventional method, after attaching second (i.e., upper) and first (i.e., lower) semiconductor substrates to each other, memory cell transistors may be formed on the second semiconductor substrate. Thus, when a second dielectric layer in the second semiconductor substrate is thermally treated, impurity ions in the first semiconductor substrate may thermally diffuse when the temperature is in the high temperature range, so that a channel region may not be readily formed. However, according to the present method, the thermal treatment process for densifying the second dielectric layer may be performed at a sufficiently high temperature without the thermal diffusion of the impurity ions in the first semiconductor substrate. As a result, the second memory cell transistor on the second semiconductor substrate 200 may have improved reliability.

Referring to FIGS. 3 and 4, a first insulating interlayer 140 is formed on the first semiconductor substrate 100 to cover the first memory cells 120 and the first selection transistors 130. Further, a second insulating interlayer 240 is formed on the second semiconductor substrate 200 to cover the second memory cells 220 and the second selection transistors 230. In this example embodiment, the first insulating interlayer 140 and the second insulating interlayer 240 may include oxide, such as undoped silicate glass (USG), phosphosilicate glass (PSG), borophosphosilicate glass (BPSG), spin-on glass (SOG), flowable oxide (FOx), plasma-enhanced tetraethyl orthosilicate (PE-TEOS), and the like. Further, the first insulating interlayer 140 and the second insulating interlayer 240 may be formed by a CVD process, a plasma-enhanced chemical vapor deposition (PE-CVD) process, an ALD process, or a high-density plasma chemical vapor deposition (HDP-CVD) process, as examples.

For example, the first insulating interlayer 140 may include silicon oxide substantially the same as that of the second insulating interlayer 240. Alternatively, the first insulating interlayer 140 may include silicon oxide different from that of the second insulating interlayer 240.

In this example embodiment, the second insulating interlayer 240 on the second semiconductor substrate 200 may have a thickness greater than that of the first insulating interlayer 140. For example, the thickness of the second insulating interlayer 240 may be about 1.5 times to about 3 times larger than that of the first insulating interlayer 140. Here, the second semiconductor substrate 200 may correspond to an upper substrate in a subsequent attaching process. A lower surface of second semiconductor substrate 200 may undergo a planarization process and a wet etching process, which reduces the thickness of the second semiconductor substrate 200 to form a planarized second semiconductor substrate 250 (see FIG. 5). Given the relatively large thickness of the second insulating interlayer 240, the planarized second semiconductor substrate 250 having a reduced thickness would not be broken during the planarization and wet etching processes, or during later processes used for reducing the thickness of the second semiconductor substrate 200.

Alternatively, the second insulating interlayer 240 may have a thickness substantially the same as that of the first insulating interlayer 140. In this case, a protective layer (not shown) may be formed on the second insulating interlayer 240. The protective layer may serve to prevent the planarized second semiconductor substrate 250 from being broken during the planarization and wet etching processes used for removing the lower surface of the second semiconductor substrate 200, or during later processes. Therefore, the protective layer may include an easily removable material. Examples of the protective layer may include a silicon oxide layer, a photoresist film, and the like.

For example, when the second insulating interlayer 240 includes oxide, the protective layer may include oxide having an etching selectivity faster than the second insulating interlayer 240. In such a case, only the protective layer may be readily removed using and etching process, and not the second insulating interlayer 240.

In this example embodiment, examples of the protective layer may include oxide such as USG, PSG, BPSG, SOG, FOx, HDP-CVD oxide, and the like.

Alternatively, the protective layer may include the photoresist film. When the protective layer includes the photoresist film, the photoresist film may be removed by an ashing process and/or a stripping process.

Referring to FIG. 5, a lower surface of the second semiconductor substrate 200 has been partially removed to reduce the thickness of the second semiconductor substrate 200, resulting in thinned second semiconductor substrate 250.

In this example embodiment, the removal of the lower surface of the second semiconductor substrate 200 may be accomplished by planarizing the lower surface of the second semiconductor substrate 200 by a chemical mechanical polishing (CMP) process, and by partially removing the lower surface of the second semiconductor substrate 200 by a wet etching process.

Particularly, a protective tape (not shown) for protecting integrated circuits in the second semiconductor substrate 200 may be additionally attached to an upper surface of the second semiconductor substrate 200. The lower surface of the second semiconductor substrate 200 may be mechanically grinded by a rough grinding process using a rough grinding wheel. Here, since a grinding speed of the rough grinding process may be fast, the lower surface of the second semiconductor substrate 200 may be partially removed to remain the second semiconductor substrate 200 with several micrometers thickness measured from a target removal thickness. Here, the rough grinding wheel may have a lower end including abrasive particles such as diamond.

After performing the rough grinding process, the wet etching process may be performed on the second semiconductor substrate using an etching solution. In the wet etching process, the etching solution may be sprayed on the grinded lower surface of the thinned second semiconductor substrate 250 with the thinned second semiconductor substrate 250 being rotated from a spray nozzle. The etching solution may be chemically reacted with silicon in the thinned second semiconductor substrate 250 to etch the lower surface of the thinned second semiconductor substrate 250. An example of an etching solution used in the wet etching process may include a solution mixed with water or an acetic acid ($CH_3COOH$) solution and nitric acid ($HNO_3$) and hydrofluoric acid. Further, in order to maintain accuracy of the wet etching process, the wet etching process may be performed by stages having different process conditions. The stages may use different etching solutions to control etching rates.

After removing the lower surface of the second semiconductor substrate 200 by the mechanical grinding process and the wet etching process, the protective tape may be removed from the upper surface of the thinned second semiconductor substrate 250.

According to one example embodiment, the thinned second semiconductor substrate 250 may have a thickness of about 0.01 times to about 0.03 times that of the first semiconductor substrate 100. Particularly, the thickness of the thinned second semiconductor substrate 250 may be about 0.05 μm to about 1.50 μm, in the present embodiment. Although the thickness of the second semiconductor substrate 200 becomes thinner, the thickness of the thinned second semiconductor substrate 250 may be greater than that of the second impurity regions 225.

After the wet etching process, a cleaning process may be additionally performed to remove foreign substances on the lower surface of the thinned second semiconductor substrate 250. Examples of a cleaning solution used in the cleaning process may include an SC1 solution, a mixing solution of de-ionized water and hydrofluoric acid, and the like. The SC1 solution may include ammonia water ($NH_4OH$), hydrogen peroxide ($H_2O_2$) and deionized water. The mixing solution of de-ionized water and hydrofluoric acid may include hydrofluoric acid with degree of purity of about 100%, and a have volume ratio of about 200:1 to about 1,000:1 between the de-ionized water and the hydrofluoric acid.

As a result, the thinned second semiconductor substrate 250 may have a flat lower surface. Further, since the second impurity regions 225 having the impurity ions are formed in the thinned second semiconductor substrate 250, the thinned second semiconductor substrate 250 may be partially used for a channel region of serially connected second memory cells 220.

Figure 6:
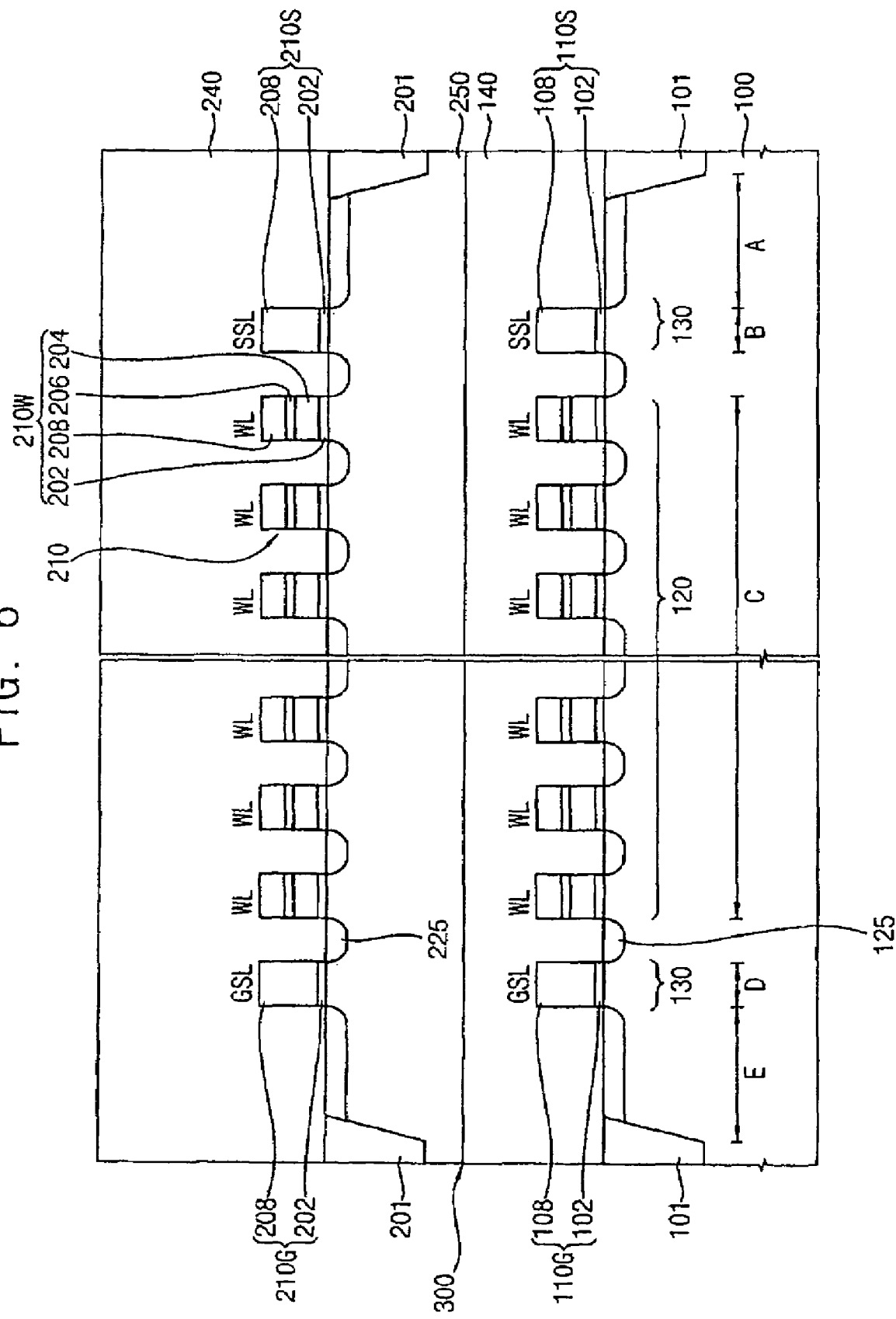

Referring to FIG. 6, the flat lower surface of the thinned second semiconductor substrate 250 is attached to the first insulating interlayer 140 of the first semiconductor substrate 100 at boundary 300.

In this example embodiment, the attaching process between the first semiconductor substrate 100 and the thinned second semiconductor substrate 250 may be performed at a temperature of about 350° C. to about 450° C. After the attaching process, the first memory cell transistors 120 and the second memory cell transistors 220 become vertically stacked on the first semiconductor substrate 100 to form dual channel regions by the serially connected first and second memory cells 120 and 130, respectively.

Here, to ensure electrical contacts between the first and the second gate electrode structures 110 and 210 and the first and the second selection transistors 130 and 230, the first and the second gate electrode structures 110 and 210 may be vertically aligned with the first and the second selection transistors 130 and 230.

Figure 7:
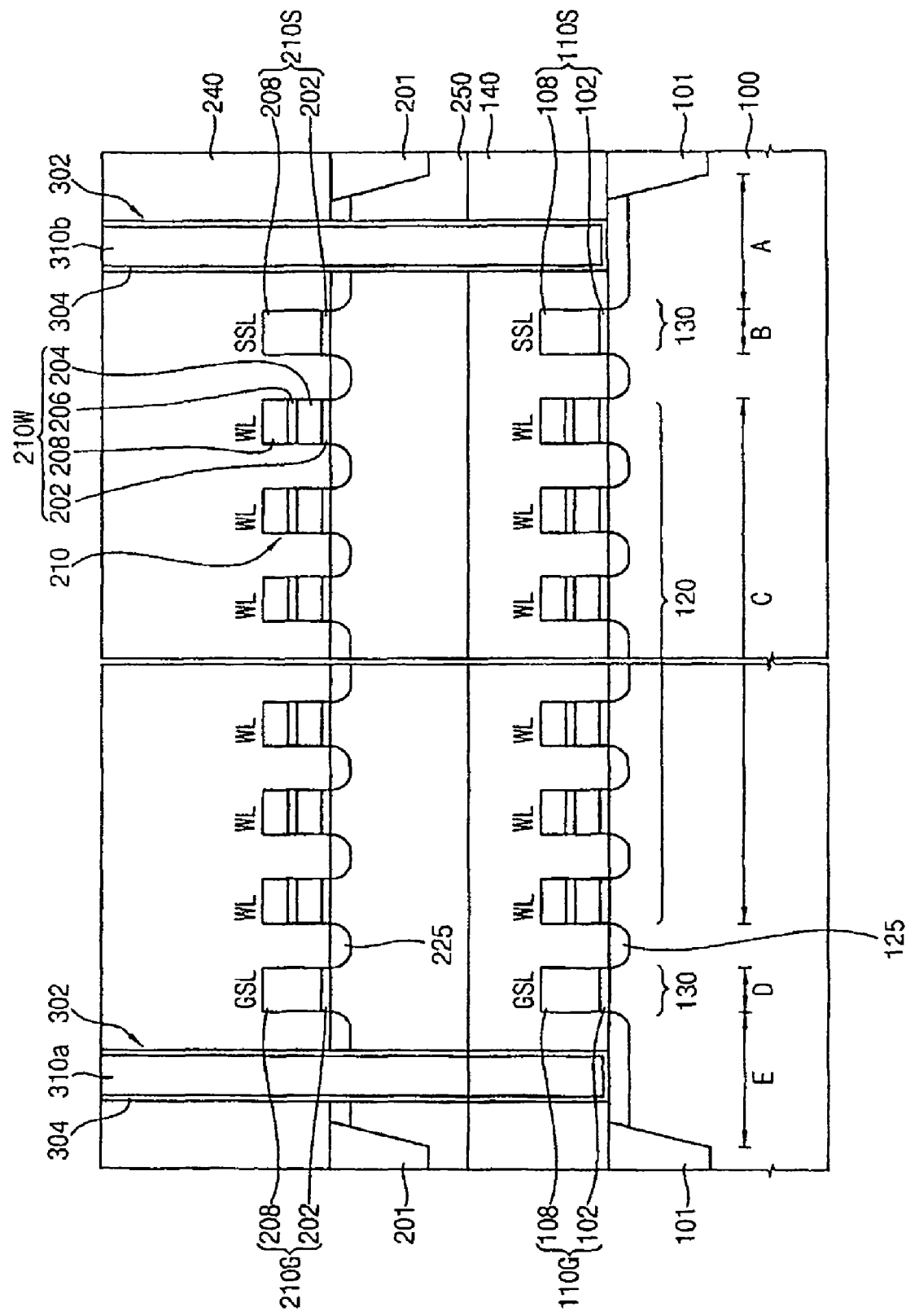

Referring to FIG. 7, a second photoresist pattern (not shown) is formed on the second insulating interlayer 240. The second photoresist pattern may expose portions of the second insulating interlayer 240 where plugs 310a and 310b electrically connected to the first selection transistors 130 of the first semiconductor substrate 100 and the second selection transistors 230 of the thinned second semiconductor substrate 250. That is, the second photoresist pattern may have openings partially exposing upper surfaces of the second insulating interlayer 240 corresponding to the upper surfaces of the second impurity regions 225. Here, the plugs may include a well contact plug 310a connected to a metal wiring, which is arranged at one end of the ground selection line, and a bit line contact plug 310b connected to a bit line, which is arranged at one end of the string selection line.

The second insulating interlayer 240 is partially etched using the second photoresist pattern as an etching mask to form contact holes 302 vertically formed through the second insulating interlayer 240, the thinned second semiconductor substrate 250 and the first insulating interlayer 140. The contact holes 302 expose the upper surface of the first semiconductor substrate 100. The contact holes 302 are then filled with a conductive material to form the plugs 310a and 310b. Examples of the conductive material may include a metal such as copper (Cu), gold (Au), tungsten (W), polysilicon doped with impurities, and metal silicide, as examples. In this example embodiment, the plugs 310a and 310b in the contact holes 302 may include tungsten.

According to one example embodiment, before forming the plugs 310a and 310b in the contact holes 302, a barrier layer 304 may be additionally formed on inner surfaces of the contact holes 302 and upper surface of the second insulating interlayer 240. The barrier layer 304 may prevent the metal in the plugs 310a and 310b from diffusing into the first insulating interlayer 140 and the second insulating interlayer 240 during formation of the plugs 310a and 310b, which improves electrical characteristics of the plugs 310a and 310b. Examples of the barrier layer 304 may include a titanium layer, a titanium nitride layer, a titanium/tungsten layer, a platinum/silicon layer, an aluminum layer, an alloy metal layer thereof, and the like. Further, a seed layer (not shown) may be formed on the barrier layer 304. The seed layer may serve as a basis for forming the plugs 310a and 310b using an electroplating process. That is, a metal layer may be formed by performing the electroplating process on the seed layer.

According to another example embodiment, the metal layer may be continuously formed on the second insulating interlayer 240 to fill up the contact holes 302 without the formations of the barrier layer 304 and the seed layer. The metal layer may be formed by a sputtering process, a physical vapor deposition (PVD) process, an ALD process, or other process.

After forming the metal layer, the meal layer on the second insulating interlayer 240 may be partially removed by a CMP process to form the plugs 310a and 310b electrically connected between the first impurity regions 125 at one end of the first selection transistors 130 and the second impurity regions 225 at one end of the second selection transistors 230. That is, the well contact plug 310a is arranged at one end of the ground selection line GSL and the bit line contact plug 310b is arranged at one end of the string selection line SSL.

Further, a source contact plug (not shown) may be electrically coupled between a first common source electrode (not shown), which is connected between the first impurity regions 125, and a second common source electrode (not shown), which is connected between the second impurity regions 225. Furthermore, gate contact plugs (not shown) may be electrically coupled to the first gate electrode structures 110 and the second gate electrode structures 210.

The bit line (not shown) may be electrically connected between the bit line contact plugs 310b may be formed over the second insulating interlayer 240. Further, the wiring may be electrically coupled between the well contact plugs 310a.

As mentioned above, the first selection transistors 130 and the second selection transistors 230 connected to both sides of the memory cells 120 and 220 having the dual structure serially connected to one another may be electrically connected to each other through the plugs 310a and 310b to operate the semiconductor device having the stack-type memory cells.

According to this example embodiment, the second memory cells 220 may be formed on the thinned second semiconductor substrate 250 under a condition in which the thinned second semiconductor substrate 250 may be separated from the first semiconductor substrate 100. Thus, the impurities in the first semiconductor substrate 100 do not thermally diffuse during the conventional thermal treatment process for crystallizing the dielectric layer.

Further, after forming the stack-type memory cells and the selection transistors, the first impurity regions 125 and the second impurity regions 225 at respective ends of the selection transistors may be electrically coupled to each other through the plugs by a single process. As a result, the semiconductor device may be manufactured by a simple processes.

According to the present invention, a stack-type memory cell may be manufactured by preparing a first semiconductor substrate and a second semiconductor substrate that includes serially connected memory cells and insulating interlayers covering the memory cells, reducing the thickness of the second semiconductor substrate by the CMP process and the wet etching process, and attaching the thinned second semiconductor substrate to the first semiconductor substrate.

Therefore, the second memory cells may be formed on the thinned second semiconductor substrate under a condition in which the thinned second semiconductor substrate may be separated from the first semiconductor substrate. Thus, the impurity ions in the first semiconductor substrate do not thermally diffuse during the conventional thermal treatment process for crystallizing the dielectric layer. As a result, the channel region may be readily formed in the first semiconductor substrate regardless of the thermal treatment process so that the dielectric layer may be densified, thereby improving operation characteristics of the memory cells.

Further, since the plugs may be electrically connected to the memory cells by a single process after forming the memory cells, the method of manufacturing the semiconductor device may be simplified.

Having described the preferred embodiments of the present invention, it is noted that modifications and variations may be made by persons skilled in the art in light of the above teachings. It is therefore to be understood that such modifications and variations are considered to be within the scope and the spirit of the invention. It is intended by the following claims to claim that which is literally described herein and all equivalents thereto, including all modifications and variations that fall within the scope of each claim.

What is claimed is:

1. A method of manufacturing a semiconductor device, comprising:
    providing a first substrate and a second substrate each having a plurality of memory cells and selection transistors formed thereon;
    forming a first insulating interlayer on the first substrate and a second insulating interlayer on the second substrate to cover the memory cells and the selection transistors respectively formed thereon;
    forming a thinned second substrate by partially removing a lower surface of the second substrate;
    attaching a lower surface of the thinned second substrate to the first insulating interlayer of the first substrate; and
    electrically connecting the selection transistors on the first substrate and the second substrate by forming plugs through the second insulating interlayer, the thinned second substrate, and the first insulating interlayer.

2. The method of claim 1, wherein the second insulating interlayer has a thickness of about 1.5 times to about 3.0 times that of the first insulating interlayer.

3. The method of claim 1, wherein partially removing the lower surface of the second substrate comprises:
    planarizing the lower surface of the second substrate by a chemical mechanical polishing (CMP) process; and
    removing the planarized lower surface of the second substrate by a wet etching process.

4. The method of claim 3, further comprising forming a protective layer on the second substrate to prevent the second substrate from breaking during removal of the lower surface of the second substrate.

5. The method of claim 4, wherein the protective layer comprises a silicon oxide layer or a photoresist film.

6. The method of claim 3, wherein the wet etching process uses an etching solution including nitric acid ($HNO_3$) and hydrofluoric acid mixed with water or an acetic acid ($CH_3COOH$) solution.

7. The method of claim 3, wherein the wet etching process comprises spraying an etching solution on the planarized lower surface of the second substrate with the second substrate being rotated.

8. The method of claim 3, further comprising, after the wet etching process, cleaning the second substrate to remove particles from the second substrate.

9. The method of claim 1, wherein the thinned second substrate has a thickness of about 0.01 times to about 0.03 times that of the first substrate.

10. The method of claim 1, wherein the thinned second substrate has a thickness of about 0.05 μm to about 1.50 μm.

11. The method of claim 1, wherein each of the memory cells comprises a gate structure having a metal-first oxide-silicon nitride-second oxide-silicon (MONOS) structure and impurity regions formed at different sides of the gate structure.

12. The method of claim 11, wherein the metal comprises tantalum nitride.

13. The method of claim 11, wherein the first oxide comprises any one selected from the group consisting of aluminum oxide ($Al_2O_3$), zirconium oxide ($ZrO_2$), zirconium silicate ($ZrSiO_4$), hafnium oxide ($HfO_2$), and hafnium silicate (HfSiO).

14. The method of claim 11, further comprising thermally treating the gate structure at a temperature of about 850° C. to about 1,200° C. to crystallize the first oxide.

15. The method of claim 1, wherein attaching the first substrate and the second substrate to each other comprises thermally treating the first and second substrates at a temperature of about 350° C. to about 450° C.

16. The method of claim 1, wherein the plugs include polysilicon doped with impurities, metal, or metal silicide.

17. The method of claim 1, wherein forming the plugs comprises:
    forming contact holes through the second insulating interlayer, the second substrate and the first insulating interlayer; and
    filling the contact holes with a conductive material to form the plugs.

18. The method of claim 17, further comprising forming a barrier layer on inner surfaces of the contact holes and an upper surface of the second insulating interlayer.

19. A method of manufacturing a semiconductor device, comprising:

providing a first substrate and a second substrate each having a plurality of memory cells and selection transistors formed thereon;

forming a first insulating interlayer on the first substrate and a second insulating interlayer on the second substrate to cover the memory cells and the selection transistors respectively formed thereon;

forming a thinned second substrate by partially removing a lower surface of the second substrate;

attaching a lower surface of the thinned second substrate to the first insulating interlayer of the first substrate; and forming at least one plug through the second insulating interlayer, the thinned second substrate, and the first insulating interlayer to electrically connect a selection transistor on the first substrate to a corresponding selection transistor on the second substrate; including:

forming contact holes through the second insulating interlayer, the second substrate and the first insulating interlayer; and filling the contact holes with a conductive material.

20. The method of claim 19, wherein forming the at least one plug includes:

forming a first plug electrically connecting a source selection transistor formed on the first substrate to a source selection transistor formed on the second substrate; and forming a second plug electrically connecting a ground selection transistor formed on the first substrate to a ground selection transistor formed on the second substrate.

* * * * *